(12) United States Patent
Delprat et al.

(10) Patent No.: US 7,405,136 B2
(45) Date of Patent: Jul. 29, 2008

(54) METHODS FOR MANUFACTURING COMPOUND-MATERIAL WAFERS AND FOR RECYCLING USED DONOR SUBSTRATES

(75) Inventors: Daniel Delprat, Crolles (FR); Eric Neyret, Sassenage (FR); Oleg Kononchuk, Grenoble (FR); Patrick Reynaud, Saint Martin d'Here (FR); Michael Stinco, Voiron (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 164 days.

(21) Appl. No.: 11/472,693

(22) Filed: Jun. 21, 2006

(65) Prior Publication Data

US 2007/0216042 A1   Sep. 20, 2007

(30) Foreign Application Priority Data

Mar. 14, 2006   (EP) .................................. 06290421

(51) Int. Cl.
*H01L 21/30* (2006.01)
(52) U.S. Cl. ...................................... 438/458; 438/795
(58) Field of Classification Search ................ 438/458, 438/795
See application file for complete search history.

(56) References Cited

U.S. PATENT DOCUMENTS

| 6,211,041 | B1 | 4/2001 | Ogura ......................... 438/458 |
| 6,492,682 | B1* | 12/2002 | Akiyama et al. ............. 257/347 |
| 6,596,610 | B1* | 7/2003 | Kuwabara et al. ........... 438/458 |
| 2001/0029072 | A1 | 10/2001 | Kuwahara .................... 438/151 |
| 2003/0170990 | A1* | 9/2003 | Sakaguchi et al. .......... 438/690 |
| 2003/0219957 | A1 | 11/2003 | Kuwabara et al. ........... 438/400 |
| 2004/0031979 | A1 | 2/2004 | Lochtefeld et al. .......... 257/233 |
| 2004/0187769 | A1 | 9/2004 | Aoki ........................... 117/95 |
| 2005/0032376 | A1* | 2/2005 | Seuring et al. .............. 438/689 |
| 2005/0112845 | A1 | 5/2005 | Ghyselen et al. ............ 438/455 |
| 2005/0202658 | A1 | 9/2005 | Neyret ........................ 438/517 |

FOREIGN PATENT DOCUMENTS

| EP | 1 087 041 A1 | 3/2001 |
| JP | 11297583 | 10/1999 |
| WO | WO 2005/014895 A1 | 2/2005 |
| WO | WO 2005/086227 A1 | 9/2005 |

* cited by examiner

*Primary Examiner*—Trung Dang
(74) *Attorney, Agent, or Firm*—Winston & Strawn LLP

(57) ABSTRACT

This invention provides methods for manufacturing compound-material wafers and methods for recycling donor substrates that results from manufacturing compound-material wafers. The provided methods includes at least one further thermal treatment step configured to at least partially reduce oxygen precipitates and/or nuclei. Reduction of oxygen precipitates and/or nuclei, improves the recycling rate of the donor substrate.

23 Claims, 2 Drawing Sheets

METHODS FOR MANUFACTURING COMPOUND-MATERIAL WAFERS AND FOR RECYCLING USED DONOR SUBSTRATES

FIELD OF THE INVENTION

The invention relates to methods for manufacturing compound-material wafers and for recycling used donor substrates obtained from the manufacture of compound-material wafers; in particular, this invention related to methods for manufacturing silicon on insulator (SOI) type wafers.

BACKGROUND OF THE INVENTION

Use of compound-material wafers, in particular, silicon on insulator (SOI) type wafers, as starting materials in the semiconductor device manufacturing process is becoming more and more important. One way to fabricate such wafers with good crystalline quality at reasonable cost is by transferring a layer from a donor substrate also of good crystalline quality onto a handle substrate. Specifically, donor and handle substrates are bonded, and then the donor substrate is detached at a predetermined splitting area previously formed in the donor substrate. In the SMART-CUT® process, the splitting area is formed by implanting atomic species, in particular hydrogen ions or rare gas ions, into the donor substrate. The advantage of this process is that the remainder of the donor substrate, which remains after the transfer of the layer onto the handle substrate, can be re-used as a donor substrate in a subsequent component material wafer fabrication process. Thus, one donor substrate can serve for several compound-material wafers, like SOI type wafers.

It appeared, however, that the donor substrate could only be re-used three to four times, because from run to run, the crystalline quality of the donor substrate deteriorated. As a consequence, the crystalline quality of the final SOI substrate also deteriorated.

Efforts have been made to allow the recycling of the used donor substrates. Japanese patent application JP19980114176 (Japanese publication JP11297583), for example, proposes to first polish the donor substrate to remove the surface step at the edge of the wafer, which is present after the transfer of a layer onto the handle substrate, and then to carry out a second finishing polishing step before re-using the remainder of the donor substrate as a new donor substrate. U.S. Pat. No. 6,211,041, although not being directed to recycling processes, discloses a different approach, which consists in providing, right from the beginning, a silicon substrate with an appropriate oxygen content. An appropriate oxygen content is claimed to prevent the creation of crystal defects, which according to the authors, are related to the presence of oxygen precipitates generated in the SOI device layer during the heat treatments that the wafers undergo during the SOI fabrication process.

Despite this disclosure, however, the number of possible re-uses of donors substrate is still not satisfactory. In particular, it appears that controlling the initial oxygen content does not prevent crystal defects from appearing in the final SOI layer after multiple reuse. Thus, improvements in this area are needed and these are now provided by the present invention.

SUMMARY OF THE INVENTION

The present invention includes providing methods for manufacturing compound-material wafers and/or methods for recycling or reusing used donor substrates in a manufacturing process for compound-material wafers. These methods allow an increased number of re-uses of the used donor substrate and, at the same time, allow the fabrication of good quality compound-material wafers at reasonable cost.

In one embodiment, the invention relates to a method for fabricating a compound-material wafer from an initial donor substrate and a handle substrate which comprises transferring a layer from the initial donor substrate onto the handle substrate thereby fabricating a compound-material wafer and providing a remainder donor substrate, and applying at least one thermal treatment configured to reduce oxygen precipitates or nuclei in the remainder donor substrate to facilitate re-use in subsequent fabricating steps, wherein the thermal treatment is applied to the initial donor substrate prior to transferring the layer, or to the remainder donor substrate after transferring the layer, or both to the initial donor substrate and to the remainder donor substrate.

In another embodiment, the invention relates to an improvement in a method for recycling a remainder donor substrate from which one or more layers have been transferred during fabrication of one or more compound-material wafers. The improvement comprises applying at least one thermal treatment configured to reduce oxygen precipitates or nuclei in the remainder donor wafer to facilitate re-use in subsequent fabrication steps, and reusing the thermally-treated remainder donor substrate for fabrication of one or more additional compound-material wafers.

In these methods, at least one thermal treatment step comprises a rapid thermal oxidation step performed in an oxygen containing atmosphere. Also, the surface of the substrate from which the layer was transferred can be polished either prior to the rapid thermal oxidation step, or subsequent to the rapid thermal oxidation step, or both prior and subsequent to the rapid thermal oxidation step. Also, another thermal treatment step comprises a rapid thermal anneal step performed in an oxygen free atmosphere, and this can be followed by a polishing step performed subsequently to the rapid thermal anneal step. These methods are of particular interest for use in connection with the formation of silicon on insulator substrates.

Further aspects and details and alternate combinations of the elements of this invention will be apparent from the following detailed description and are also within the scope of the inventor's invention.

BRIEF DESCRIPTION OF THE DRAWINGS

The present invention may be understood more fully by reference to the following detailed description of the preferred embodiment of the present invention, illustrative examples of specific embodiments of the invention and the appended figures in which.

DETAIL DESCRIPTION OF THE PREFERRED EMBODIMENTS

Figure 1:
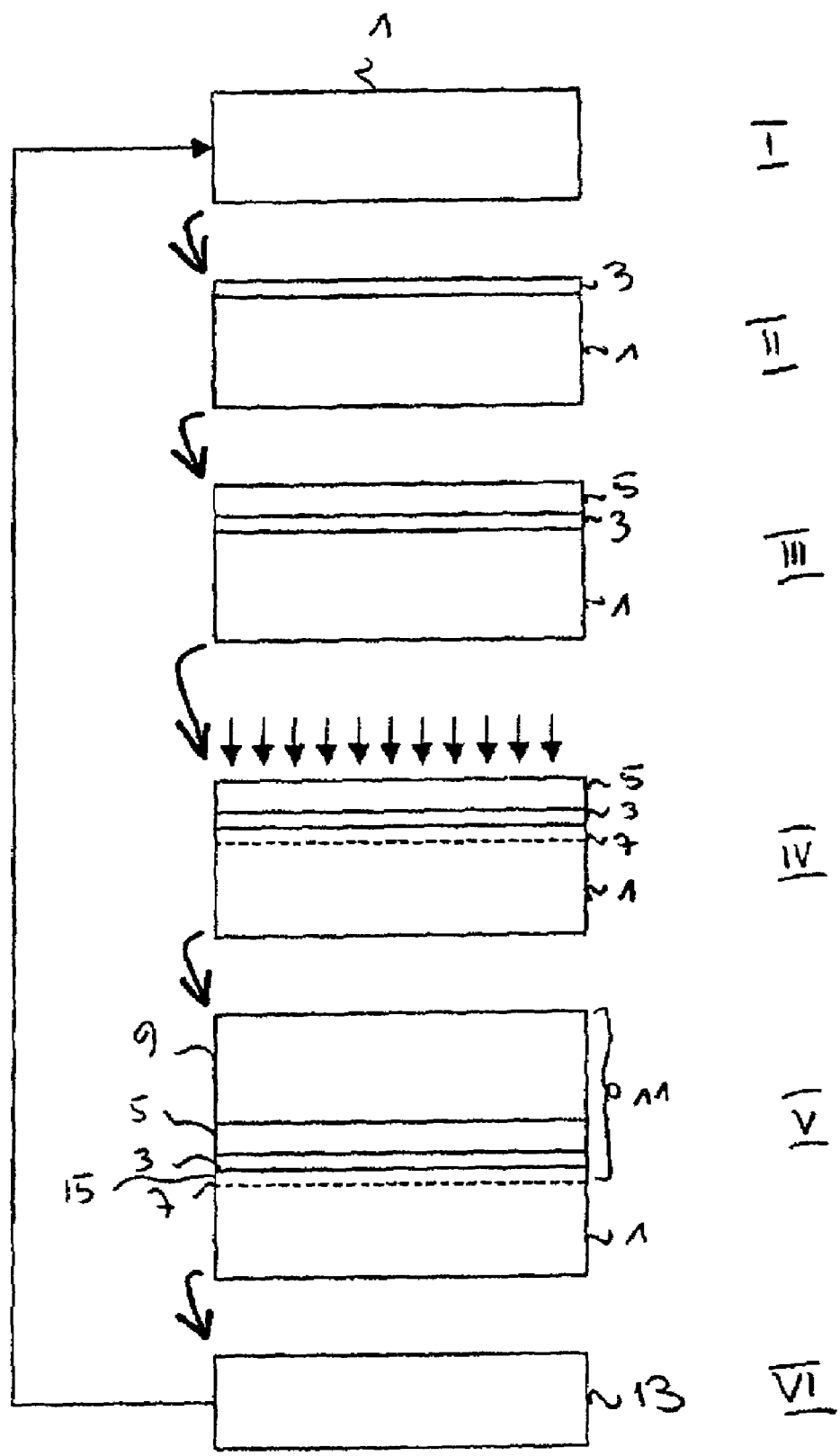
FIG. 1 illustrates a first embodiment of the inventive method.

Generally, methods for manufacturing compound-material wafers, in particular silicon on insulator (SOI) type wafers, from an initial donor substrate wafer include the following steps: form an insulating layer over the initial donor substrate; form a predetermined zone of weakness or splitting area in the initial donor substrate; attach the initial donor substrate to a handle substrate; and then detach the donor substrate at the predetermined splitting area, thereby transferring a layer of the initial donor substrate onto the handle substrate to form a compound-material wafer. Also, the donor substrate after splitting of the transferred layer (the remainder donor substrate) can be reused to provide further transferred layers by the above process.

The methods of this invention add one or more additional treatment steps to the these manufacturing and reuse processes. The additional treatment steps at least partially reduce or remove, in particular by dissolution, oxygen precipitates and/or nuclei in the initial donor substrate and/or in the remainder donor substrate. A preferred additional treatment step is a thermal treatment step. As the presence of the precipitates or nuclei is apparently linked to the creation of crystalline defects in the substrates, their dissolution during an additional thermal treatment allows the re-use of the donor substrate, and this more often than is the case today, as the creation of crystalline defects during re-use can be limited by the additional thermal treatment step.

The presence of oxygen nuclei in the wafers is believed to be due to the wafer fabrication process. During the ingot pulling, impurities are incorporated into the ingot. One of those is interstitial oxygen, which during pulling and cool down gathers to form nuclei. During subsequent heat treatments, typically in a range of 900° C. to 1100° C., the nuclei become precipitates due to diffusion of interstitial oxygen.

Preferably, at least one of the at least one thermal treatments steps can be a rapid thermal oxidation step. "Rapid" here means a temperature rise of at least 20° C./sec, preferably at least 30° C./sec, so that dissolution of the precipitates and/or nuclei takes place. Surprisingly, it has been found that the presence of oxygen during treatment leads to an improved removal of the oxygen precipitates and/or nuclei in the donor substrate. Therefore, the rapid thermal oxidation step can be advantageously performed in an atmosphere having an oxygen concentration from at least 5% up to 100% and/or an oxygen flow rate of 5 to 20 liters per minute, and in particular, an flow oxygen rate of 10 liters per minute. For these concentrations and flows, improved results with respect to the removal of oxygen have been obtained. According to a preferred embodiment, at least one rapid thermal oxidation step is carried out in a temperature range between 1150° C. and 1300° C., and in particular, between 1200° C. and 1250° C. In this temperature range, the oxygen precipitates and/or nuclei in the donor substrate can be, at least partially, reduced, in particular by dissolution.

Preferably, the rapid thermal oxidation step can be performed in, e.g., a single wafer furnace, for a duration between 15 seconds to 5 minutes, in particular, for a duration of 30 seconds to 2 minutes. If a batch anneal type furnace is used to carry out the rapid thermal oxidation step, this step can be performed for between 1 minute to 5 hours. To achieve the desired effect of reduction of oxygen, thus, both a single wafer furnace, as well as a batch type furnace can be used, so that the process can be easily adapted to the manufacturing process already in place.

During the rapid thermal oxidation treatment, an oxide layer of a thickness in a range of 50 Å to 500 Å is grown on the initial donor substrate or the remainder of the donor substrate. Thus, the rapid thermal oxidation step does not only serve to remove oxygen in particular by dissolution, but at the same time provides a high quality thin oxide layer, which in a subsequent step serves as starting layer for the formation of the insulating layer. Usually the insulating layer is an oxide of the same type as that which is thermally grown on the donor substrate. This has the advantage that the thin oxide layer has high quality, and that the insulating layer has good crystalline properties.

The rapid thermal oxidation step can be performed at various points during the manufacturing process. According to one preferred embodiment, the rapid thermal oxidation step is performed on the initial donor substrate prior to forming an insulating layer on a donor substrate and/or after a layer has been detached from the donor substrate. Advantages of performing the rapid thermal oxidation step on the initial donor substrate include that oxygen precipitates and/or nuclei already present in the substrate can at least partially be removed. Advantages of the rapid thermal oxidation step include that it does not alter the surface roughness properties, so that a rapid thermal oxidation can be performed on the initial donor substrate before starting the manufacturing process.

The advantage of performing the rapid thermal oxidation step after a layer has been detached from the donor substrate, that is after the fabrication of the compound-material wafer, is that oxygen precipitates and/or nuclei which have been created during the prior heat treatment steps of the manufacturing process can be dissolved, and thus, reduced. A rapid thermal oxidation step can be performed after one or more reuses of the donor wafer in order to prevent the creation of crystalline defects in the final SOI layer.

In some cases, manufacturing methods for compound-material wafers can also include polishing of the surface of the donor substrate at which detachment occurred. Then, the rapid thermal oxidation step can be performed before the final polishing step. Also, since the rapid thermal oxidation does not alter the quality of the surface, it can be carried out after the polishing step. Thus, a rapid thermal oxidation step can be performed before and/or after the polishing step to keep the crystalline quality of the substrate high.

In an alternative embodiment, at least one of the thermal treatment steps can be a rapid thermal anneal step, carried out in an oxygen free atmosphere. Such a treatment also reduces, in particular by dissolution, at least partially, the precipitates and/or nuclei, but without creating an oxide layer. As a consequence, re-use of the donor substrate be achieved with a thermal treatment step without oxygen.

Preferably, a thermal anneal step can be performed in a hydrogen and/or argon atmosphere. In this atmosphere an optimized dissolution effect can be observed. Preferably, a thermal anneal step (or the rapid thermal oxidation) can be performed with a temperature ramp of at least 20° C./s, in particular at least 25° C./s, when a batch furnace is used, or with a temperature ramp of at least 30° C./s, in particular at least 50° C./s, when a single wafer furnace is used. For these temperature ramps, oxygen dissolution can be achieved independently of the use of a single wafer furnace or a batch type furnace.

Preferably, the thermal anneal step is carried out between before forming an insulating layer on the donor substrate step or after transferring a layer from the donor substrate. The thermal anneal step can be is followed by a polishing step, so that, even if the thermal anneal step deteriorates the quality of the surface of the donor substrate, it is possible to keep a sufficiently high surface quality due to the polishing step.

According to a preferred embodiment of the methods for manufacturing (and/or reusing) compound-material wafers, the remainder of the donor substrate (after a layer has been transferred) can be re-used as initial donor substrate at least once (and possibly twice or more times) before a first or further thermal treatment step is carried out. Depending on the rate of creation of oxygen precipitates and/or nuclei, further thermal treatment steps are carried out when necessary, to keep the number of process steps low while at the same time ensuring a sufficiently high crystalline quality in the donor substrate or the remainder of the donor substrate. Thus, the final SOI product also has a sufficiently high crystalline quality.

FIG. 1 illustrates a preferred embodiment of the invention. The following description is directed to manufacturing silicon on insulator (SOI) type compound-material wafers. However, use in manufacturing is an example and is not limiting; the invention is also useful in manufacturing other types of compound-material wafers.

In step I, an initial donor substrate 1, here a silicon (Si) wafer, is provided.

In step II, a thermal treatment step according to the invention is carried out. In this embodiment, the thermal treatment step includes a rapid thermal oxidation step, which creates a thin silicon oxide layer 3 on top of the donor substrate 1. The thin silicon dioxide layer 3 typically grows up to a thickness of 50 Å to 500 Å and presents good crystalline properties and surface roughness.

The rapid thermal oxidation step is performed by placing the donor substrate 1 in an oxygen atmosphere with an oxygen flow rate of 5 to 20 liters per minute, and in particular, an oxygen flow rate of 10 liters per minute. The donor substrate is then brought to a temperature between 1000° C. and 1300° C. for a duration of between 15 seconds to 5 minutes, and in particular, for a duration of 30 seconds to 2 minutes. In case a batch anneal type furnace is used, a plurality of donor substrates can be treated, and the necessary thermal treatment is then performed for a duration between 1 minute and 5 hours. The atmosphere preferably includes more than 5% oxygen and up to 100% oxygen.

In addition to growing the thin oxide layer 3, oxygen precipitates and/or nuclei which might be present in the donor substrate 1 are at least partially reduced by dissolution. It is believed that the oxygen precipitates and/or nuclei dissolve to form interstitial oxygen. Thereby, the creation of crystalline defects in the donor substrate 1 due to the presence of oxygen can be suppressed or limited. In particular, during the rapid thermal oxidation step, crystalline defects which might be present in the part of the donor substrate which will be transferred later onto a handle substrate are also limited.

In step III, an insulating layer 5, preferably silicon dioxide, is thermally grown on the thin silicon dioxide layer 3. This layer will serve as the insulating layer in the silicon on insulator structure.

In step IV, atomic species are implanted through the insulating layer 5 to create a predetermined splitting area 7, inside the donor substrate 1. Typically, the implanted atomic species comprise hydrogen and/or rare gas ions like helium and are introduced by implantation or co-implantation. Co-implantation is realized in such a way that at least two different species, for example hydrogen and helium ions, are implanted sequentially, the helium being implanted preferably before the hydrogen.

In step V, handle substrate 9, here a silicon wafer, is bonded to the insulating layer 5 on the donor substrate 1. Then, a heat treatment is carried out during which detachment at the predetermined splitting area 7 occurs such that a silicon on insulator wafer 11 is created.

In step VI, the remainder 13 of the donor substrate 1, that is the portion of the donor substrate without the layer 15 that has been transferred onto the handle substrate 9 in order to create the SOI wafer 11, is then recycled to prepare for reuse. This recycling step can also include optional processes such as polishing and/or cleaning as known in the prior art. The recycled remainder 13 of the donor substrate 1 can be reused as initial donor substrate 1, which is illustrated in FIG. 1 by the arrow linking steps VI and I.

In an alternative embodiment, the thermal treatment step (such as a rapid thermal oxidation step), step II, can be performed, instead of during every iteration of this fabrication process, only after every second, third, fourth, etc. iteration. The frequency with which step II is performed depends on the number of defaults (defects) due to oxygen precipitates and/or nuclei which are created during the various heat treatments which the substrate undergoes during the fabrication process, e.g., during the thermal oxide growth step or during the splitting step. In an alternative embodiment, handle substrates, 9, other than silicon, e.g., quartz, can be used.

Figure 2:
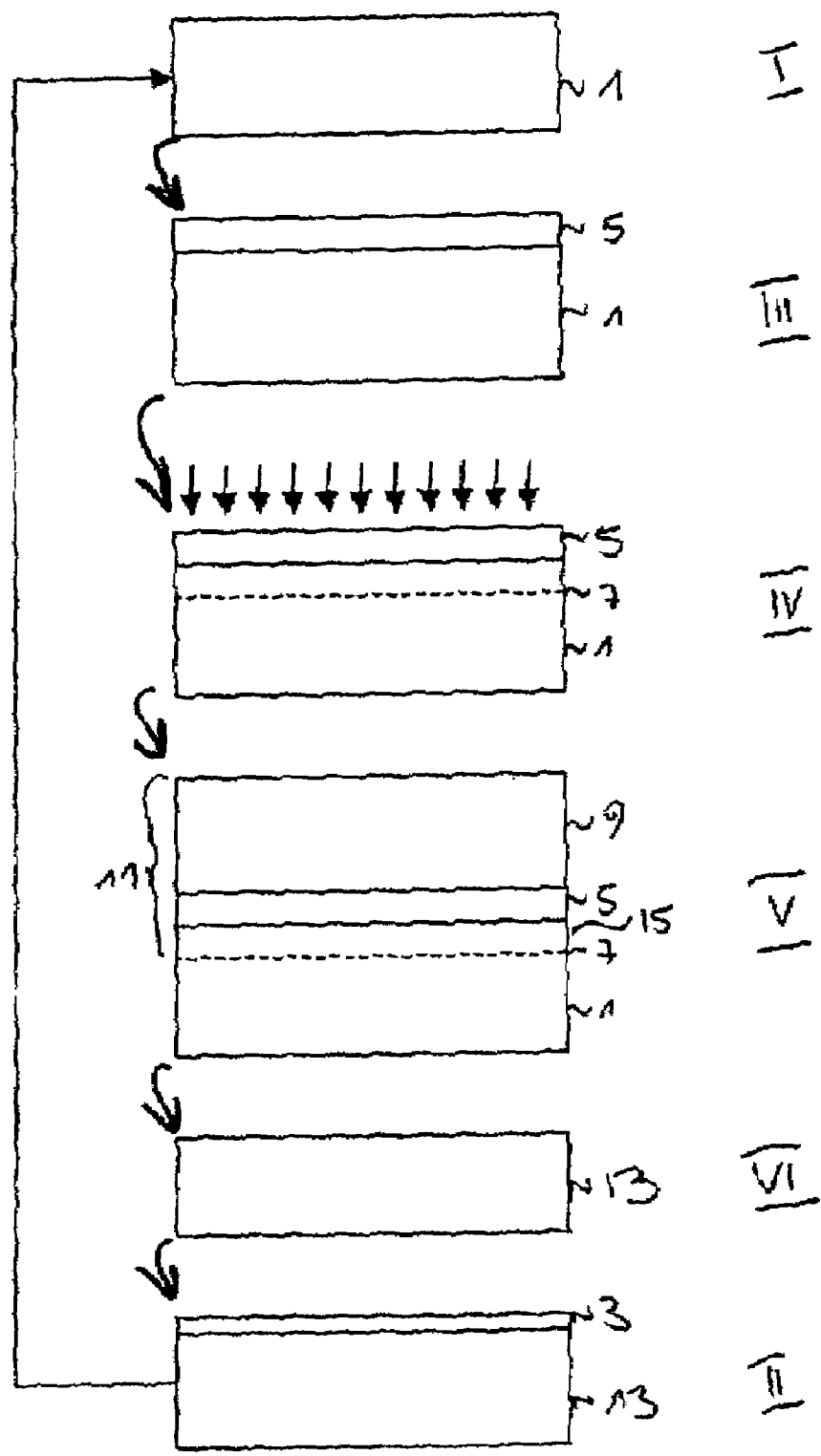
FIG. 2 illustrates a second embodiment of the inventive method.

FIG. 2 illustrates a further preferred embodiment of the invention. It differs from the embodiment of FIG. 1 in that the thermal treatment step, e.g., a rapid thermal oxidation step, is now carried out at the end of the manufacturing process. The thermal treatment step is identified as step II in FIG. 2. Consequently, during step III, the donor substrate is a fresh substrate not having yet served in a manufacturing process, instead of a donor substrate on which thin oxide layer 3 has already been grown, so that the thermal oxide layer 5 is formed directly on the initial donor substrate 1.

The other steps of this embodiment, steps I, IV, V and VI, are similar to corresponding steps I, IV, V, and VI, respectively, of the embodiment of FIG. 1. In particular, after detachment that occurs in step V, a remainder 13 of the donor substrate 1 is obtained. Also, the remainder donor substrate (instead of a fresh substrate) can be recycled and used in a further step I.

By performing the thermal treatment step after detachment of the SOI wafer 11, oxygen precipitates and/or nuclei which were created during thermal treatments, e.g., the thermal treatments in steps III and V, can be completely or partially dissolved during subsequent step II. Thereby, when subsequently re-used to fabricate a further SOI layer 15, the remainder 13 of the donor substrate 1 will have a high crystalline quality.

In alternative embodiments, optional polishing and/or cleaning steps can be performed before the rapid thermal oxidation step, step II. This subsequent rapid thermal oxidation step is performed under the same conditions as in the first embodiment of FIG. 1. Also, the optional cleaning and/or polishing steps be performed after the rapid thermal oxidation treatment; or a rapid thermal oxidation step can be performed before and after the polishing and/or cleaning step.

The thermal treatment step, e.g., the rapid thermal oxidation step, is not necessarily performed during each iteration of the fabrication process. But, depending on the creation of oxygen precipitates and/or nuclei, it can alternately be performed only after every second, third, fourth, etc. iteration. The fabrication process can thereby be optimized.

In a further preferred embodiment of the invention, the thermal treatment step includes a rapid thermal annealing step in an atmosphere not containing oxygen instead of a rapid thermal oxidation step. Typically, such a rapid thermal annealing step is performed in a hydrogen and/or argon atmosphere with the other process parameters (other than oxygen concentration) being the same as those used for the rapid thermal oxidation step. Rapid thermal annealing also can completely or partially reduce oxygen precipitates and/or nuclei by dissolution. However, because rapid thermal annealing can negatively affect surface quality of a wafer, a polishing step preferably follows the rapid thermal annealing step in order to reduce surface roughness of the donor substrate 1. Also, in an oxygen free atmosphere, thin oxide layer 3 will not be formed.

In further embodiments, steps VI and II of the embodiment of FIG. 2 can also be performed as an independent method for recycling method used donor substrates. The invention also includes further advantageous combinations of the above-described steps and embodiments.

Unlike the prior art, in the method according to the invention, precipitates and/or nuclei are not prevented from creation, but are preferably removed during the processing. In fact, creation precipitates and/or nuclei cannot be prevented, because they are created during the heat treatments which are part of the fabrication process.

As a consequence of the methods of this invention, the donor substrate can be more often reused while at the same time the maintaining a high quality of the layer 15 transferred onto SOI wafer 11. Thus, the compound-material wafer fabrication process becomes less expensive.

EXAMPLE

It has been demonstrated that by carrying out the additional heat treatment step of this invention to reduce oxygen precipitates and/or nuclei, the number of crystalline defaults in the end product, the SOI wafer 11, can be reduced by a factor of at least 6.

This result has been demonstrated by growing a silicon oxide layer with a thickness of 6000 Å on two silicon wafers. By being 4 times the 1500 Å thickness typical for the isolation layer 5 of a SOI wafer, the growth of this oxide layer was believed to simulate the thermal treatments occurring during four iterations of an SOI fabrication process. For one wafer, no additional heat treatment, e.g., no rapid thermal oxidation, was performed; for the second wafer, the rapid thermal oxidation of this invention was performed. Analysis of the defects found to be present in both wafers demonstrated the above mentioned reduction in crystalline defects.

The preferred embodiments of the invention described above do not limit the scope of the invention, since these embodiments are illustrations of several preferred aspects of the invention. Any equivalent embodiments are intended to be within the scope of this invention. Indeed, various modifications of the invention in addition to those shown and described herein, such as alternate useful combinations of the elements described, will become apparent to those skilled in the art from the subsequent description. Such modifications are also intended to fall within the scope of the appended claims. In the following (and in the application as a whole), headings and legends are used for clarity and convenience only.

What is claimed is:

1. A method for fabricating a compound-material wafer from an initial donor substrate and a handle substrate which comprises:

transferring a layer from the initial donor substrate onto the handle substrate thereby fabricating a compound-material wafer and providing a remainder donor substrate, and applying at least one rapid thermal treatment configured to generate a temperature rise of at least 20° C./sec to reduce oxygen precipitates or nuclei in the remainder donor substrate to facilitate its re-use in subsequent fabricating steps while reducing crystalline defects in the subsequent layers to be transferred, wherein the thermal treatment is applied to the remainder donor substrate after transferring the layer to facilitate recycling of the remainder donor substrate.

2. The method according to claim 1 which further comprises reusing the thermally-treated remainder donor substrate for the fabrication of one or more additional compound-material wafers.

3. The method according to claim 1, wherein the compound-material wafer comprises a silicon on insulator wafer.

4. The method according to claim 1, further comprising, prior to transferring:

providing an insulating layer over the initial donor substrate, providing a zone of weakness in the initial donor substrate, and attaching the initial donor substrate to the handle substrate so that the insulating layer and a portion of the initial donor substrate is transferred to the handle substrate.

5. A method for fabricating a compound-material wafer from an initial donor substrate and a handle substrate which comprises:

transferring a layer from the initial donor substrate onto the handle substrate thereby fabricating a compound-material wafer and providing a remainder donor substrate, and applying at least one thermal treatment comprising a rapid thermal oxidation step performed in an oxygen containing atmosphere with the thermal oxidation step configured to generate a temperature rise of at least 20° C./sec to reduce oxygen precipitates or nuclei in the remainder donor substrate to facilitate its re-use in subsequent fabricating steps while reducing crystalline defects in the subsequent layers to be transferred, wherein the thermal treatment is applied to the remainder donor substrate after transferring the layer to facilitate recycling of the remainder donor substrate.

6. The method according to claim 5, wherein the rapid thermal oxidation step further comprises providing the oxygen in the oxygen containing atmosphere at a concentration of 5 to 100% and with a flow rate of 5 to 20 l/min.

7. The method according to claim 5, which further comprises conducting the rapid thermal oxidation step to grow an oxide layer having a thickness of 50 Å to 500 Å on the initial or remainder donor substrate.

8. The method according to claim 5, wherein the rapid thermal oxidation step further comprises exposure in a single wafer furnace to a temperature ramp of at least 30 to 50° C./s.

9. The method according to claim 8, wherein the rapid thermal oxidation step is conducted at a temperature in a range between 1150° C. and 1300° C. for 15 sec to 5 min.

10. The method according to claim 8, wherein the rapid thermal oxidation step is conducted at a temperature of between 1200° C. and 1250° C. for 30 sec to 2 min.

11. The method according to claim 5, wherein the rapid thermal oxidation step further comprises exposure in a batch furnace to a temperature ramp of at least 25° C./s.

12. The method according to claim 11, wherein the rapid thermal oxidation step further comprises exposure to a temperature of 1000° C. and 1300° C. in the batch anneal type furnace for a duration between 1 min to 5 hrs.

13. The method according to claim 5, which further comprises polishing the surface of the substrate from which the layer was transferred, wherein the polishing is applied prior to the rapid thermal oxidation step, subsequent to the rapid thermal oxidation step, or both prior and subsequent to the rapid thermal oxidation step.

14. The method according to claim 5, wherein at least one of the thermal treatment steps further comprises a rapid thermal anneal step performed in an oxygen free atmosphere comprising hydrogen, argon, or mixtures thereof.

15. The method according to claim 14, further comprising a polishing step performed subsequently to the rapid thermal anneal step.

16. The method according to claim 14, wherein the oxygen free rapid thermal anneal further comprises exposure in a batch furnace to a temperature ramp of at least 20 to 25° C./s.

17. The method according to claim 14, wherein the rapid thermal anneal step further comprises exposure in a single wafer furnace to a temperature ramp of at least 30 to 50° C./s.

18. In a method for recycling a remainder donor substrate from which one or more layers have been transferred during fabrication of one or more compound-material wafers, the improvement which comprises applying at least one rapid thermal treatment configured to generate a temperature rise of at least 20° C./sec to reduce oxygen precipitates or nuclei in the remainder donor wafer to facilitate re-use in subsequent fabrication steps while reducing crystalline defects in the layer to be transferred, and reusing the thermally-treated remainder donor substrate for fabrication of one or more additional compound-material wafers.

19. The method according to claim 18, wherein the compound-material wafer comprises a silicon on insulator wafer.

20. The method according to claim 18, wherein at least one thermal treatment step comprises a rapid thermal oxidation step performed in an oxygen containing atmosphere.

21. The method according to claim 20, which further comprises polishing the surface of the substrate from which the layer was transferred, wherein the polishing is applied prior to the rapid thermal oxidation step, or subsequent to the rapid thermal oxidation step, or both prior and subsequent to the rapid thermal oxidation step.

22. The method according to claim 20, wherein at least one thermal treatment step further comprises a rapid thermal anneal step performed in an oxygen free atmosphere.

23. The method according to claim 22, which further comprises a polishing step performed subsequently to the rapid thermal anneal step.

* * * * *